(12) United States Patent
Park

(10) Patent No.: US 7,885,100 B2
(45) Date of Patent: Feb. 8, 2011

(54) PHASE CHANGE RANDOM ACCESS MEMORY AND LAYOUT METHOD OF THE SAME

(75) Inventor: Hae Chan Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 236 days.

(21) Appl. No.: 12/332,787

(22) Filed: Dec. 11, 2008

(65) Prior Publication Data

US 2009/0231899 A1    Sep. 17, 2009

(30) Foreign Application Priority Data

Mar. 12, 2008   (KR) ...................... 10-2008-0023040
Mar. 12, 2008   (KR) ...................... 10-2008-0023042

(51) Int. Cl.
*G11C 11/00* (2006.01)
(52) U.S. Cl. .................. 365/163; 365/158; 365/171
(58) Field of Classification Search ................ 365/163, 365/158, 171
See application file for complete search history.

(56) References Cited

U.S. PATENT DOCUMENTS 7,746,688 B2 *   6/2010   Kim et al. ................... 365/163

FOREIGN PATENT DOCUMENTS

| KR | 1020040095926 A | 11/2004 |
|---|---|---|
| KR | 1020060022009 A | 3/2006 |
| KR | 10-0610014 B1 | 8/2006 |
| KR | 10-0621774 B1 | 9/2006 |
| KR | 10-0714475 B1 | 4/2007 |
| KR | 1020070060685 A | 6/2007 |
| KR | 10-0827706 B1 | 4/2008 |
| KR | 2008-38732 B1 | 4/2008 |

* cited by examiner

*Primary Examiner*—Son Dinh
*Assistant Examiner*—Nam Nguyen
(74) *Attorney, Agent, or Firm*—Ladas & Parry LLP

(57) ABSTRACT

A phase change random access memory (PRAM) includes a cell array divided into an active region and a dummy active region. A bitline is formed across the active region and the dummy active region and a global wordline is formed in the active region so as to intersect with the bitline. The cell array includes a phase change memory cell formed at an intersection point of the bitline and the global wordline that is electrically connected with the bitline and the global wordline. The cell array further includes a phase change dummy cell formed below the bitline in the dummy active region that is electrically isolated from the bitline. The dummy cell maintains a turn-off state as the dummy cell and the bitline are electrically isolated from each other.

40 Claims, 12 Drawing Sheets

PHASE CHANGE RANDOM ACCESS MEMORY AND LAYOUT METHOD OF THE SAME

CROSS-REFERENCE TO RELATED APPLICATIONS

The present application claims priority to Korean patent application numbers 10-2008-0023040 filed on Mar. 12, 2008 and 10-2008-0023042 filed on Mar. 12, 2008, both of which are incorporated herein by reference in their entirety.

BACKGROUND OF THE INVENTION

The present invention relates generally to a phase change random access memory (PRAM), and more particularly to a PRAM including dummy cells and a layout method of the same.

In general, when forming memory cells of a PRAM, a cell array may be formed by repeated arrangement of memory cell strings including diodes formed by selective epitaxial growth.

That is, in a single cell array, an 8-bit cell string may be arranged in a global wordline direction and a global row decoding line connected to a global row decoder (global X-decoder) together with the 8-bit cell strings may be arranged in a bitline direction.

Herein, since the global row decoding line is used for the purpose of transferring bias to a gate of a local switch transistor placed between the cell arrays, the global row decoding line is not connected with memory cells. Further, in order to make process conditions similar to those of the memory cell, a dummy cell is formed below the global row decoding line.

As shown in FIG. 1, a dummy cell string 12 having the same structure as the 8-bit memory cell string may be formed below the global row decoding line GXDEC to make the condition similar to the memory cell because the global row decoding line GXDEC is formed in upper layer of bitlines BL0~BL7 (i.e. in the same layer as the global wordline). Herein, the global decoding line GXDEC describes a line that transfers a signal for selecting global wordline outputted from the global row decoder.

A lower via 14 is formed on either side of the dummy cell string 12 on a dummy active region 10. In order to interrupt electrical connection between the global row decoding line GXDEC and the dummy cell string 12, a via for electrically connecting the lower via 14 and the global row decoding line GXDEC is not formed as marked by a dotted circle 16 in FIG. 1. Also, the dummy active region 10 is kept in a ground voltage (VSS) state.

However, since the dummy cell string 12 has, like other memory cells, a structure that is respectively electrically connected with the bitlines BL0~BL7, there is a problem that when one bitline BL is selected, current Ipara may flow to the dummy active region 10 through a dummy cell electrically connected to the selected bitline BL. For example, when bitline B5 is selected, the current Ipara may flow to the dummy active region 10 through the dummy cell electrically connected to the selected bitline BL5.

That is, when one bitline BL5 is selected, a predetermined voltage (generally, a boost voltage VPP) is supplied to the selected bitline BL5 and thus data is accessed in the memory cell. At this time, since the dummy active region 10 below the global row decoding line GXDEC is in the ground (VSS) state, current Ipara flows from the bitline BL5 to the dummy active region 10 through the dummy cell connected with the selected bitline BL5.

This parasitic current Ipara passing through the dummy cell may affect data state according to phase change of the memory cell. Therefore, this is problematic in that a sense amplifier that senses and amplifies the data may malfunction, resulting in difficulty in distinguishment of '1' and '0' in the data.

Also, as no upper via is formed on the dummy cell string 12, a pattern collapse may occur at the two outermost bitlines BL0, BL7 of the bitlines BL0~BL7.

The pattern collapse will be described in more detail with respect to FIG. 2. As the bitlines BL0~BL7 are disposed with equal spacing therebetween, none of the bitlines BL1~BL6 collapse.

In a memory cell region 20 in which memory cell strings (not shown) are disposed, as upper vias 24 electrically connecting the memory cell strings and global wordlines GWL0~GWL7 are formed at the outside of the two outermost bitlines BL0, BL7, the pattern collapse of the two bitlines BL0, BL7 does not occur.

However, in a dummy cell region 22, in which dummy cell strings (not shown) are disposed, the upper vias are not formed at the outside of the two outermost bitlines BL0, BL7 in order to electrically isolate the dummy cell string and a global row decoding line GXDEC, this results in problems in that the two bitlines BL0, BL7 may collapse in the direction shown in FIG. 2.

When the bitline (for example, BL0) collapses, an electrical short 26 between the upper via 24 and the bitline BL0 may occur, which results in an unwanted electrical connection between the global wordline (for example, GWL7) and the bitline BL0.

When the global wordline GWL7 and the bitline (for example, BL0) are electrically connected due to the collapse of the bitline BL0, there is a problem in that a data access error may occur because a direct current path is formed between the global wordline GWL7 and the bitline BL0.

Also, upon data access, for example, when the global wordline GWL7 is activated to a ground voltage VSS level and the bitline BL0 is activated to a boost voltage VPP level, there is a problem that consumption of the boost voltage VPP may be rapidly increased due to electrical short between the global wordline GWL7 and the bitline BL0.

Further, upon standby, for example, when the global wordline GWL7 is in an inactivated state at a boost voltage VPP level and the bitline BL0 is in an inactivated state at a ground voltage VSS level, there is a problem in that a leakage current may be rapidly increased due to electrical short between the global wordline GWL7 and the bitline BL0.

In order to solve these problems, a solution of adding a dummy line between the bitline disposed at the outside and the upper via may be considered. However, this proposed solution brings about additional problems, including an increase in the area of the cell array due to the addition of the dummy line.

Alternatively, regions of the outermost bitlines BL0, BL7, which correspond to a predetermined global wordline GWL4, may be extended toward the upper via 30.

However, extend the bitline sufficiently to prevent the pattern collapse is difficult because of the space between the bitline BL0, BL7 and the upper via 30, therefore there is a large possibility of electrical short between the bitline BL0, BL7 and the upper via 30 when the bitline BL0, BL7 is extended toward the upper via 30.

SUMMARY OF THE INVENTION

There is provided a PRAM capable of preventing data access error due to parasitic current generated in a dummy cell within a cell array.

Also, there is provided a PRAM capable of preventing electrical short between a bitline and a global wordline due to collapse of the bitline.

According to a first embodiment of the present invention, there is provided a PRAM, which comprises: a cell array divided into an active region and a dummy active region; a bitline formed across the active region and dummy active region; and a global wordline formed in the active region so as to intersect with the bitline, wherein the cell array comprises: a phase change memory cell formed at an intersection of the bitline and the global wordline in the active region, the phase change memory cell being electrically connected to both the bitline and the global wordline; and a phase change dummy cell formed below the bitline in the dummy active region, the phase change dummy cell being electrically isolated from the bitline.

Preferably, the cell array further comprises a global row decoding line in the dummy active region, the global row decoding line transfers a signal for selecting the global wordline, and wherein the phase change dummy cell is formed below the global row decoding line.

Preferably, the global row decoding line is disposed to intersect with the bitline and the global row decoding line is electrically isolated from the dummy active region.

Preferably, the phase change memory cell comprises a switching device and a phase change resistor formed between the global wordline and the bitline, and the phase change dummy cell comprises a dummy switching device and a dummy phase change resistor formed below the bitline.

Preferably, the switching device comprises a diode having a cathode terminal electrically connected to the global wordline and an anode terminal electrically connected to the phase change resistor, and the dummy switching device comprises a dummy diode having a cathode terminal electrically connected to the dummy active region and an anode terminal electrically connected to the dummy phase change resistor.

Preferably, the dummy active region is electrically connected with a ground voltage.

According to another embodiment of the present invention, there is provided a PRAM, which comprises: a cell array region; a dummy active region formed in the cell array region; an active region formed in the cell array region having a phase change memory cell; a plurality of dummy switching devices formed in a line on the dummy active region; a plurality of lower electrode contacts respectively formed on the plurality of the dummy switching devices; a plurality of dummy phase change resistors respectively formed on the plurality of the lower electrode contacts, the plurality of dummy phase change resistors being electrically connected to the plurality of dummy switching devices through the plurality of lower electrode contacts; a plurality of bitlines respectively formed above the plurality of the dummy phase change resistors, wherein the plurality of bitlines are spaced apart from the plurality of the dummy phase change resistors by a predetermined distance; and a global row decoding line formed above the plurality of the bitlines, wherein the global row decoding line is spaced apart from the plurality of bitlines by a predetermined distance.

Preferably, the dummy active region is electrically isolated from the global row decoding line.

Preferably, each dummy switching device comprises a cathode terminal electrically connected to the active region and an anode terminal electrically connected to a respective phase change resistors.

Preferably, the dummy active region is electrically connected with a ground voltage.

According to another embodiment of the present invention, there is provided a PRAM, which comprises: a plurality of global wordlines formed within a cell array region; a plurality of phase change memory cell strings formed in a first active region within the cell array region, each phase change memory cell string comprising a plurality of phase change memory cells, wherein the first active region is electrically connected to the global wordlines; at least one phase change dummy cell string formed in a second active region within the cell array region, the dummy cell string having a plurality of phase change dummy cells; and a plurality of bitlines formed between upper portions of the phase change memory cells and upper portions the phase change dummy cells and lower portions of the global wordlines, wherein the plurality of bitlines are formed as to be substantially perpendicular to the plurality of global wordlines and electrically connected with the phase change memory cells, and wherein the bitlines formed at outermost sides of the phase change memory cell string and the phase change dummy cell string have a shape projected from the region corresponding to the phase change dummy cell string extending away from a central portion of the cell array.

Preferably, the phase change dummy cell string is formed in the second active region below the global row decoding line, and the global row decoding line being disposed on a layer within the cell array region together with and parallel to the global wordlines for transferring a signal for selecting the global wordlines and be electrically isolated from the second active region.

Preferably, first lower vias and first upper vias are formed in a portion of the first active region beyond ends of the phase change memory cell string, second lower vias having the same height as the first lower vias are formed in a portion of the second active region beyond ends of the phase change dummy cell string, and wherein the global wordlines are electrically connected to the first active region through the first lower vias and the upper vias.

Preferably, the bitlines formed at the outermost sides of the phase change memory cell string and the phase change dummy cell string have a shape projected from both outermost sides of the phase change dummy cell string to an upper portion of the second lower via.

Preferably, the bitlines are formed spaced apart from the phase change dummy cell string by a predetermined distance and electrically isolated from the phase change dummy cells.

Preferably, each phase change memory cell of the plurality of phase change memory cells comprises a switching device and a phase change resistor formed between the first active region and a bitline of the plurality of bitlines, and wherein each phase change dummy cell of the plurality of phase change dummy cells comprises a dummy switching device and a dummy phase change resistor formed in the second active region.

Preferably, each switching device comprises a cathode terminal electrically connected to the first active region and an anode terminal electrically connected to the phase change resistor, and the wherein dummy switching device comprises a cathode terminal electrically connected to the second active region and an anode terminal electrically connected to the dummy phase change resistor.

Preferably, the second active region is electrically connected with a ground voltage.

According to yet another embodiment of the present invention, there is provided a PRAM, which comprises: a bitline; a global word line intersecting the bitline; a phase change memory cell formed on a first active region within a cell array region, electrically connected with the bitline and the global wordline, wherein phase change out of the phase change memory cell occurs when a first voltage is supplied to the bitline and a second voltage having lower level than the first voltage is supplied to the global wordline; and a phase change dummy cell formed on a second active region within the cell array region and electrically connected to the bitline, wherein the first active region is electrically connected to the global wordline and the second active region is electrically connected to a dummy line supplied with a third voltage having higher level than the first voltage.

Preferably, the first voltage is a boost voltage having higher level than an external power voltage, the second voltage is a ground voltage, and the third voltage is a voltage having higher level than the boost voltage.

Preferably, the phase change memory cell comprises a switching device and a phase change resistor formed between the first active region and the bitline, and wherein the phase change dummy cell comprises a dummy switching device and a dummy phase change resistor formed between the second active region and the bitline.

Preferably, the switching device comprises a diode having a cathode terminal electrically connected to the first active region and an anode electrically connected to the phase change resistor, and the dummy switching device comprises a dummy diode having a cathode terminal electrically connected to the second active region and an anode terminal electrically connected to the dummy phase change resistor.

Preferably, the phase change dummy cell is formed below a global row decoding line, the global row decoding line being disposed parallel to the global wordlines within the cell array region and electrically isolated from the second active region.

Preferably, the dummy line is electrically connected to the second active region through a via formed within a portion of the second active region beyond the phase change dummy cell.

Preferably, the dummy line is formed in a lower layer than the global wordlines.

According to a still another embodiment of the present invention, there is provided a PRAM, which comprises: bitlines; global wordlines intersecting with the bitlines; a cell array including a plurality of phase change memory cells respectively formed at intersection points of the bitlines and the global wordlines and a plurality of phase change dummy cells respectively formed between a dummy active region and the bitlines, wherein the dummy active region is electrically connected to a dummy line; and a cell array control unit selecting one of the plurality of the global wordlines and supplying a first voltage to the selected global wordline upon a data access selecting one of the plurality of the bitlines and supplying a second voltage having a level higher than the level of the first voltage to the selected bitline upon the data access, and supplying a third voltage having a level higher than the level of the second voltage to the dummy line, wherein the phase change of a phase change memory cell is carried out to access data when a potential of a respective bitlines is higher than a potential of a respective global wordlines intersecting therewith, and wherein the phase change of a phase change dummy cell is carried out when a potential of a respective bitlines is higher than a potential of the dummy active region.

Preferably, the first voltage is a ground voltage, the second voltage is a boost voltage having a level higher than the level of an external power voltage, and the third voltage has a level higher than the level of the boost voltage.

Preferably, a global row decoding line selecting the global wordlines is formed above the plurality of the dummy cells, and the global row decoding line and the dummy active region are electrically isolated from each other.

Preferably, the each memory cell comprises a switching device and a phase change resistor electrically connected between the respective global wordlines and the respective bitlines, and each dummy cell comprises a dummy switching device and a dummy phase change resistor electrically connected between the dummy active region and the respective bitlines.

Preferably, a switching device comprises a diode having a cathode terminal electrically connected to a respective global wordlines and an anode terminal electrically connected to the respective phase change resistor, and each dummy switching device comprises a dummy diode having a cathode terminal electrically connected to the dummy active region and an anode terminal electrically connected to a respective dummy phase change resistor.

According to another embodiment of the present invention, there is provided a layout method of a PRAM, which includes: forming a plurality of first active regions in which first cell array regions and first via regions are alternately disposed along a first direction on a substrate and forming at least one second active region corresponding to the first active regions, in which second cell array regions and second via regions are alternately disposed, on the substrate along the first direction; forming a phase change memory cell string in respective first cell array regions, forming a via in respective first via regions, and forming a phase change dummy cell string in respective second cell array regions; forming a plurality of bitlines in a second direction above the respective phase change memory cells and the respective phase change dummy cell in a second direction, the second direction intersecting with the first direction, wherein a bitline of the plurality of the bitlines which is adjacent to the via region is formed in a structure projected from the second cell array region to the second via region; and forming global wordlines overlapped with the respective first active region and electrically connected to the respective first active region through the via and a global row decoding line overlapped with the second active region, above the bitlines.

Preferably, in the step of forming the plurality of bitlines, the bitlines which are disposed adjacent to the first via regions are formed in a structure alternately projected to the first via region and the bitlines disposed adjacent to the second via regions are formed in a structure alternately projected to the second via regions.

Preferably, in the step of forming the bitlines, the respective bitlines are formed so as to be electrically connected with the respective phase change memory cells and electrically isolated from the respective phase change dummy cells.

According to a further embodiment of the present invention, there is provided a layout method of a PRAM, which includes: forming a plurality of first active region within a cell region and forming at least one second active region within the cell array region; forming a plurality of phase change memory cells in respective first active regions and forming a plurality of phase change dummy cells having the same structure as the phase change memory cells in the respective second active region; forming a plurality of bitlines electrically connected to the respective phase change memory cells and the respective phase change dummy cells above the respective phase change memory cells and the respective phase change dummy cells so as to intersect with the first and second active regions, wherein the bitlines are maintained at a first voltage level upon inactivation and have a second voltage level higher than the first voltage level upon activation; forming a plurality of global wordlines electrically connected to the first active region above the plurality of the bitlines so as to be overlapped with the respective active regions, wherein the global wordlines are maintained at the second voltage level state upon inactivation and have the first voltage level upon activation; and forming a dummy line electrically connected to the second active region and maintained at a level higher than the second voltage, the dummy line being formed beyond an end of the dummy cells.

Preferably, the first voltage is a ground voltage, the second voltage is a boost voltage having a level higher than an external power voltage, and the third voltage is a voltage having a level higher than the boost voltage.

Preferably, the dummy line and the plurality of the bitlines are formed at the same layer above the second active region and a via is formed between the second active region and the dummy line such that the second active region and the dummy line are electrically connected through the via.

Preferably, a third active region is formed to extend from the second active region beyond the cell array region, the dummy line is formed above the third active region, a via is formed between the third active region and the dummy line such that the second active region, the third active region, and the dummy line are electrically connected with each other through the via.

Preferably, a global row decoding line selecting the plurality of the global wordlines is formed above the plurality of the bitlines overlapped with the respective second active regions.

Preferably, the respective phase change memory cells comprise: a switching device including a first N-type semiconductor and a first P-type semiconductor formed on the first active region; and a phase change resistor formed above the first P-type semiconductor and electrically connected to the switching device.

Preferably, the respective phase change dummy cells comprise: a dummy switching device including a second N-type semiconductor and a second P-type semiconductor formed on the second active region; and a dummy phase change resistor formed above the second P-type semiconductor and electrically connected to the dummy switching device.

According to the present invention, since the dummy cells and the bitlines are electrically isolated from each other and thus the dummy cells are always maintained in a turn-off state, it is possible to remove parasitic current due to the dummy cells and thus prevent data access error.

According to the present invention, since regions of the outermost bitlines in the cell array, which correspond to the dummy cells, are extended to the outside, it is possible to prevent collapse of the outermost bitlines and thus prevent electrical short between the bitline and a global wordline.

According to the present invention, there is provided a PRAM that always maintains dummy cells in a turn-off state by supplying a voltage higher than the level of a bitline activation voltage to a dummy active region. Therefore, it is possible to prevent a data access error due to parasitic current generated in the dummy cells.

DESCRIPTION OF SPECIFIC EMBODIMENTS

Hereinafter, preferred embodiments of the present invention will be described in detail with reference to the accompanying drawings.

In one embodiment of the present invention, a PRAM in which dummy cells and bitlines are electrically isolated from each other and regions of the bitlines disposed at the outermost in a cell array region, corresponding to the dummy cell, are extended to the outside and which is thus capable of removing parasitic current due to the dummy cells and preventing collapse of the outermost bitlines is disclosed.

Figure 1:
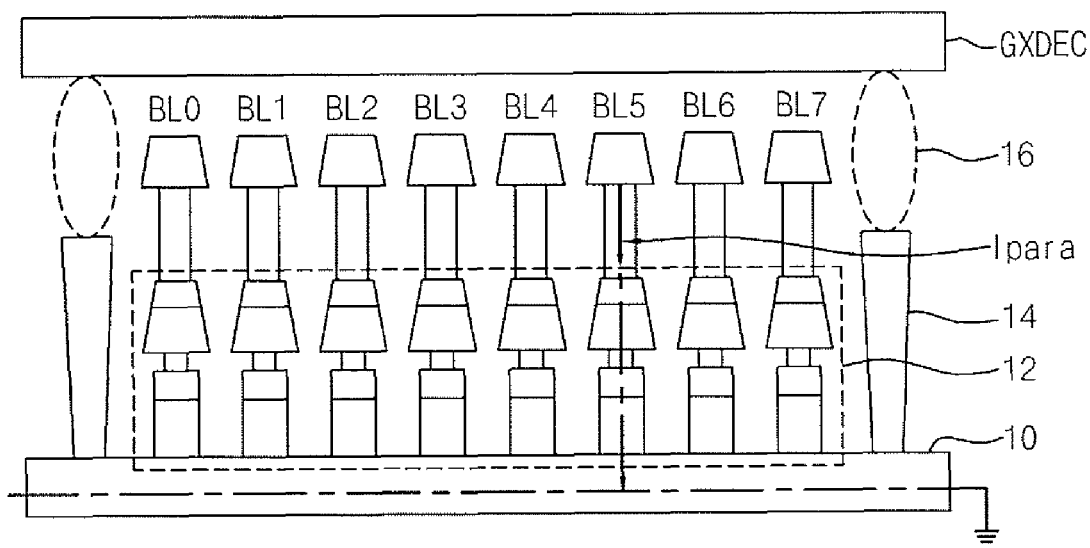
FIG. 1 is a cross-sectional view showing a structure of a dummy cell string provided in a PRAM.
Figure 2:
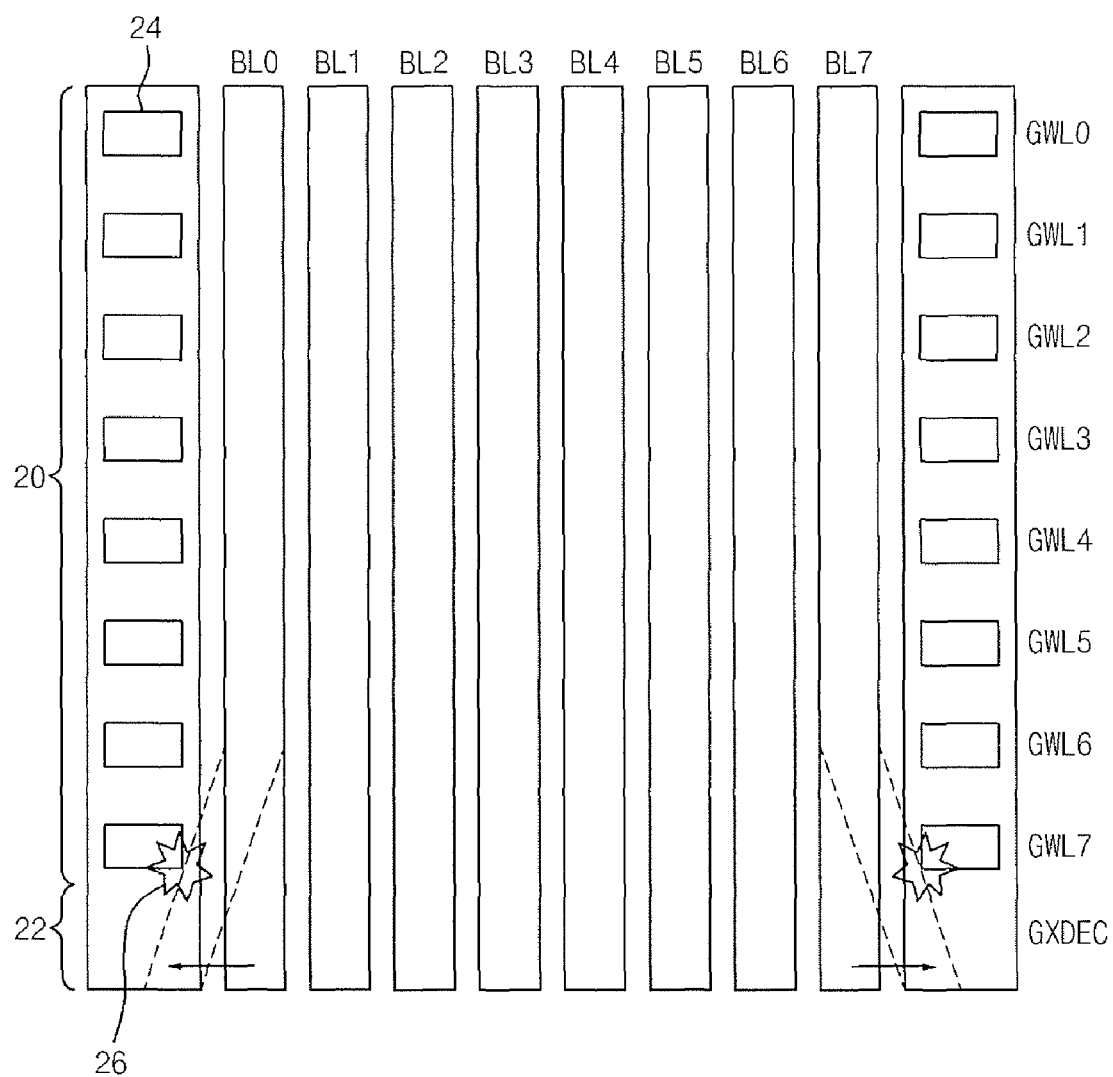
FIG. 2 is a plan view showing a bitline collapse in a PRAM.
Figure 3:
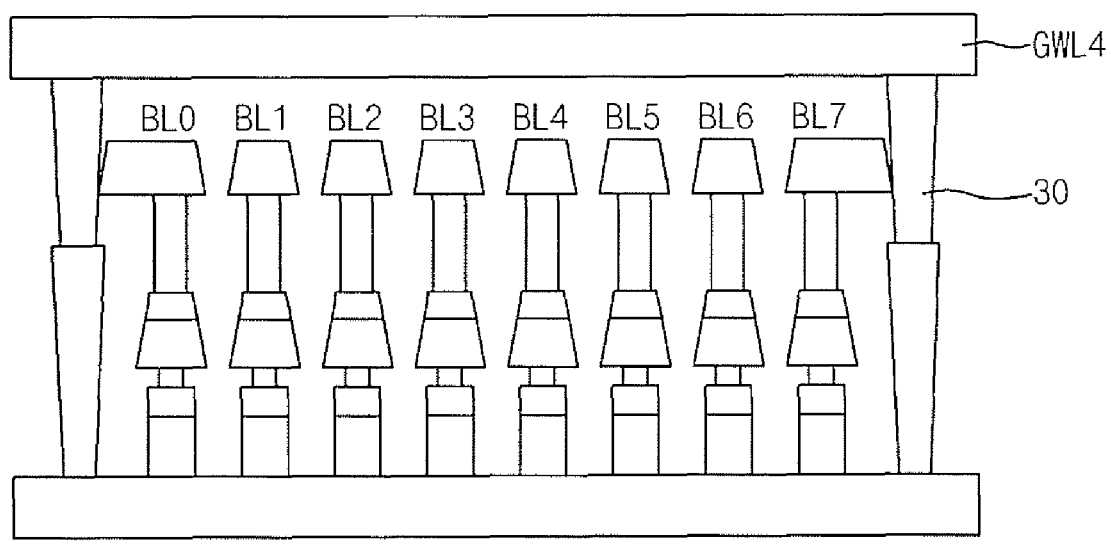
FIG. 3 is a cross-sectional view showing a bitline structure of a PRAM for preventing collapse of a bitline.
Figure 4:
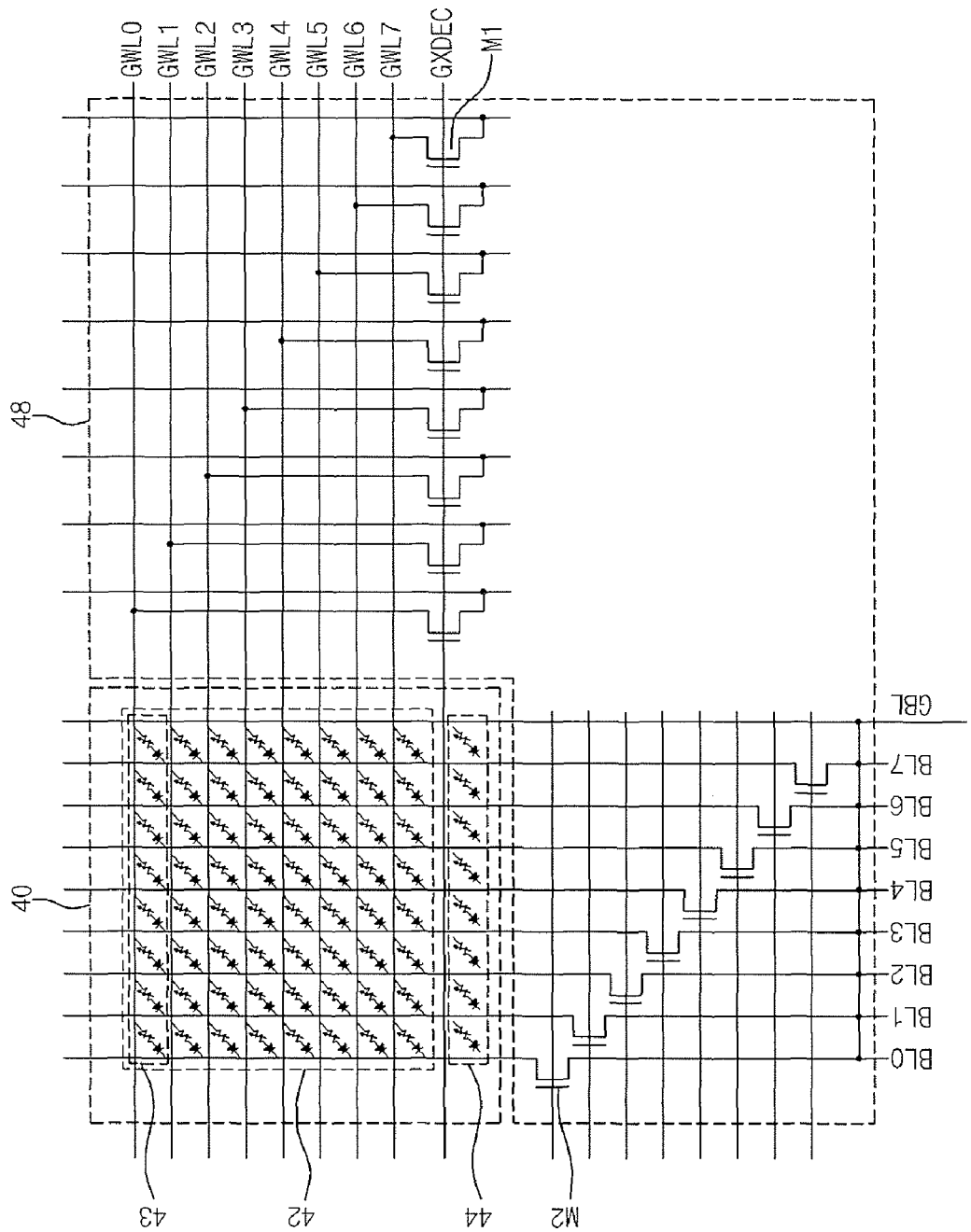
FIG. 4 is a circuit diagram showing a PRAM according to one embodiment of the present invention.

Specifically, according to the present embodiment, the PRAM includes a plurality of cell array units, each of which may include a cell array 40 and a cell array control unit 48 as shown in FIG. 4.

The cell array 40 includes a plurality of memory cell strings 42 and at least one dummy cell string 44.

Herein, each memory cell string 43 includes phase change memory cells. The phase change memory cells are arranged in the region of the cell array 40 at intersection points of bitlines BL0~BL7 and global wordlines GWL0~GWL7. The phase change memory cells are formed between active region electrically connected to respective global wordlines GWL0~GWL7 and the bitlines BL0~BL7. When the potential of a bitline BL0~BL7 is greater than the potential of a corresponding one of the intersecting global wordlines GWL0~GWL7, a phase change of the memory cell connected between the bit line and the intersecting global word line is carried out.

The dummy cell string 44 includes dummy cells formed in a dummy active region, which is electrically isolated from the bitlines BL0~BL7, and the dummy cells have the same phase change structure as that of the memory cells.

According to the present embodiment, one memory cell string 43 in the cell array 40, having the aforementioned structure, may include 8 memory cells connected to one global wordline GWL in correspondence to the bitlines BL0~BL7. The dummy cell string 44 is formed in a dummy active region adjacent to the plurality of the memory cells 42, such that both the dummy cell string 44 and the plurality of memory cells 42 are formed within the cell array region 40. More particularly, according to the present embodiment, the dummy cell string 44 is formed in the dummy active region below the global row decoding line GXDEC and includes dummy cells of the same number as the memory cells 43 connected to one global wordline GWL. A memory cell string 43 is not limited to including 8 memory cells, rather the above embodiment is illustrative and it should be understood that memory cell strings 43 having more or less memory cells are included in the present invention.

The cell array control unit 48 selects any one of the plurality of the global wordlines GWL0~GWL7 and supplies a first voltage to the selected global wordline upon data access. The cell array control unit 48 also selects any one of the plurality of the bitlines BL0~BL7 and supplies a second voltage to the selected bitline upon the data access. Herein, it is desirable that the first voltage is a ground voltage VSS and the second voltage is a boost voltage VPP having a higher voltage level than an external power voltage VDD.

The cell array control unit 48 controls the data access of the cell array 40 and may include a plurality of first switching devices that control activation of the global wordlines GWL0~GWL7 and a plurality of second switching devices that control activation of the bitlines BL0~BL7.

Herein, each first switching device may be formed of a MOS transistor M1 and the gates of the MOS transistors M1 are connected commonly to the global row decoding line GXDEC. First terminals of the MOS transistors M1 are respectively connected with the global wordlines GWL0~GWL7, and second terminals opposite the first terminals of the MOS transistors M1 are respectively connected with either the boost voltage VPP or the ground voltage VSS according to a command and a row address information.

The MOS transistors M1 are enabled when global row decoding signal is transferred through the global row decoding line GXDEC. The enabled MOS transistors M1 supply the boost voltage VPP or the ground voltage VSS to the global wordlines GWL0~GWL7. Particularly, the MOS transistors M1 supply the ground voltage VSS to a global wordline GWL selected according to the row address information of the global row decoding signal, and supply the boost voltage VPP to the remaining global wordlines GWL0~GWL7 except for the selected global wordline. For example, when a global wordline GWL0 is selected according to the row address information of the global row decoding signal, a ground voltage VSS is supplied to the global word line GWL0 and a boosting voltage VPP is supplied to the unselected global word lines GWL1~GWL7.

Each second switching device controls the activation of a respective bitline BL0~BL7 and may be formed of MOS transistors M2. Selection signals are enabled according to the command and a column address information are inputted into gates of the respective MOS transistors M2. First terminals of the MOS transistors M2 are respectively connected with the bitlines BL0~BL7 and the second terminals opposite the first terminals of the respective MOS transistors M1 are connected commonly to the global bitline GBL.

When the boost voltage VPP is supplied through the global bitline GBL and any one of the selection signals is enabled, the MOS transistors M2 supply the boost voltage VPP to a bitline BL corresponding to the enabled selection signal. For example, when the selection signal corresponding to bitline BL0 is enabled, the MOS transistor M2 corresponding to the bitline BL0 supplies the boost voltage VPP to bitline BL0.

As describe above, the PRAM according to the present embodiment includes a plurality of the memory cells 42 and a plurality of the dummy cells 44 within the cell array 40, and each memory cell 42 is selectively subject to phase change according to a potential difference between the respective global wordlines GWL0~GWL7 and the respective bitlines BL0~BL7 to access data.

The respective dummy cells are formed in the same phase change structure as the respective memory cells, and the dummy active region formed with the dummy cells 44 is disposed within a portion of the cell array that does not contain the global wordlines GWL0~GWL7, e.g. below the global row decoding line GXDEC. The dummy cells are electrically isolated from the bitlines BL0~BL7 and the global row decoding line GXDEC.

The memory cells 42 and the dummy cells 44 will be described hereinafter with reference to FIGS. 5 and 6.

The structure of the memory cell string 43 of the plurality of memory cells 42 connected to the global wordline GWL0 will be described with reference to FIG. 5. An active region 50 is defined and a plurality of switching devices 51 is formed on the active region 50. Herein, the switching device 51 includes a diode formed by selective epitaxial growth on the active region 50. The diode includes an N-type semiconductor 51a, i.e. a cathode terminal of the diode is, which is electrically connected to the active region 50 and a P-type semiconductor 51b, i.e. an anode terminal of the diode, which is electrically connected to a phase change resistor 53 through a lower electrode contact 52, which will be described in detail below.

The lower electrode contact 52 is formed on the P-type semiconductor 51b of the respective switching devices 51 and the phase change resistor 53 is formed on the respective lower electrode contacts 52. That is, the switching device 51 is electrically connected to the phase change resistor 53 through the lower electrode contact 52. Herein, the respective phase change resistors 53 may include a phase change layer 53a and an upper electrode 53b, and may further include a lower electrode (not shown).

An upper electrode contact 54 is formed on the upper electrode 53b of the respective phase change resistors 53, and the bitlines BL0~BL7 are formed on the respective upper electrode contacts 54. That is, a phase change resistor 53 is electrically connected to a respective bitline BL through the upper electrode contact 54.

Vias 55, 56 are formed in two layers in the active region 50 outside of the portion of the active region 50 formed with the memory cell string 43, and the global wordline GWL0 is formed on the upper via 56. That is, the active region 50 is electrically connected to the global wordline GWL0 through the lower via 55 and the upper via 56.

In the aforementioned structure, when the data access operation is not carried out, the global wordline GWL0 is maintained at the level of the boost voltage VPP and the bitlines BL0~BL7 are maintained at the level of the ground voltage VSS. Therefore, reverse bias is formed in the diode forming the switching device 51 and current does not flow to the phase change resistor 53.

On the contrary, when the global wordline GWL0 is activated and any one of the bitlines BL is activated by a data access operation carried out by a read or write command, the ground voltage VSS is supplied to the global wordline GWL0 and the boost voltage VPP is supplied to the activated bitline BL. For example, when the wordline GWL0 is activated and bitline BL0 is activated by a data access operation carried out by a read or write command, the ground voltage VSS is supplied to the global wordline GWL0 and the boost voltage VPP is supplied to the activated bitline BL0. Therefore, a forward bias is formed in the diode forming the switching device 51 and current flows to the phase change resistor 53.

That is, when the global wordline GWL0 and the bitline BL0 are both activated, a current path is formed from the bitline BL0 to the active region 50. As the current path is formed, current is changed according to the resistance in crystalline state and amorphous state of the phase change layer 53a that forms the phase change resistor 53, and the sense amplifier distinguishes data into '1' and '0' (logic high state and logic low state) with the changed current.

At this time, the ground voltage VSS is applied to all non-activated, i.e. non-selected bitlines BL and the boost voltage VPP is applied to all non-selected global wordlines GWL. For example, when the global wordline GWL0 and the bitline BL0 are both activated, the ground voltage VSS is applied to the non-selected bitlines BL1~BL7 and the boost voltage VPP is applied to the non-selected global wordlines GWL1~GWL7. Therefore, the selected bitline BL0 and the non-selected global wordlines GWL1~GWL7 are all in the level of the boost voltage VPP, i.e. in an equipotential state, and a current path is not formed between the selected bitline BL0 and any of the non-selected global wordlines GWL1~GWL7. Similarly, the non-selected bitlines BL1~BL7 and the selected global wordline GWL0 are all in the level of the ground voltage VSS, i.e. in an equipotential state, and a current path is not formed the between the selected global wordline GWL0 and any of the non-selected bitlines BL1~BL7.

Figure 5:
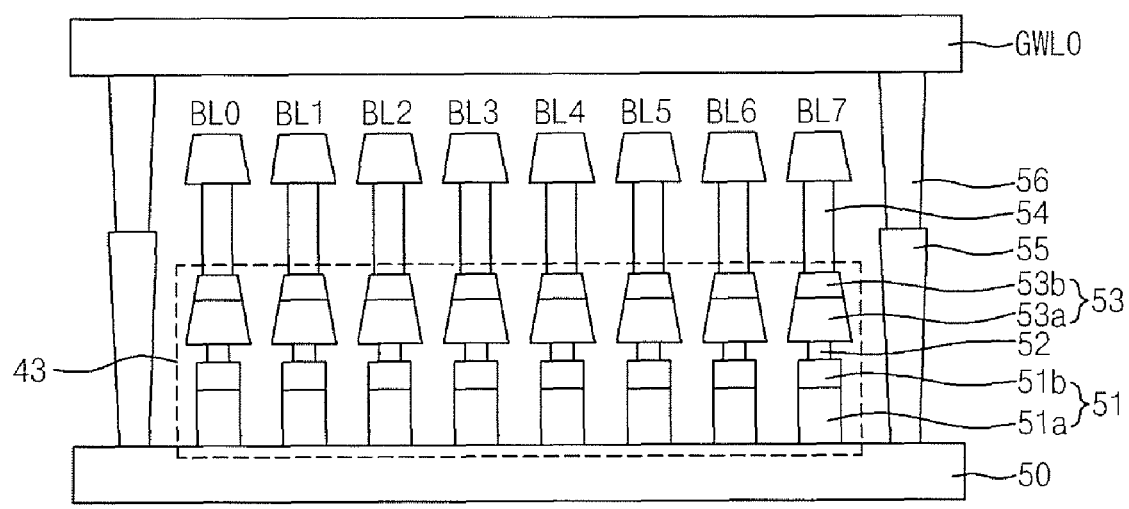
FIG. 5 is a cross-sectional view showing a structure of the memory cell string 43 in FIG. 4.
Figure 6:
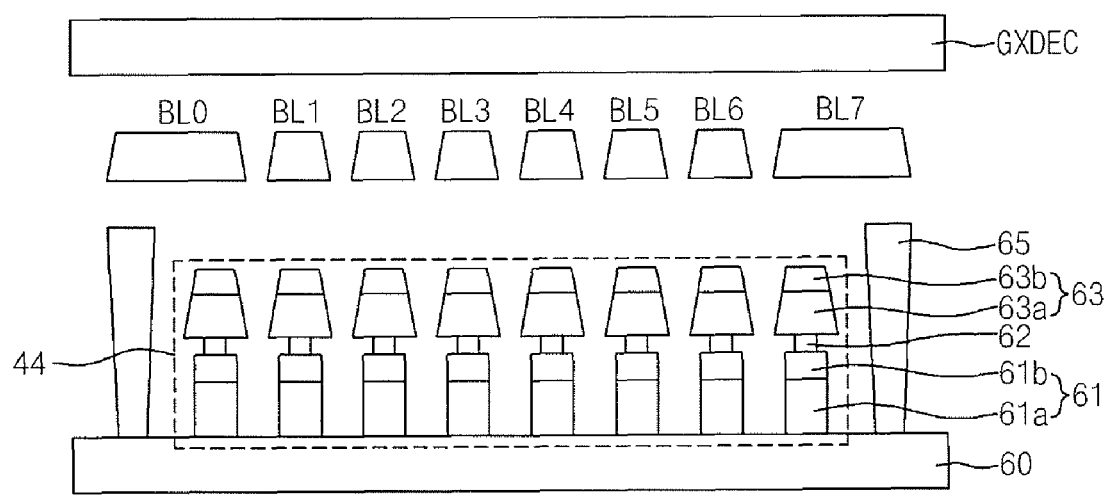
FIG. 6 is a cross-sectional view showing a structure of the dummy cell string 44 in FIG. 4.

The structure of the dummy cell string 44 corresponding to the structure of the memory cell string 43 of FIG. 5 is described with reference to FIG. 6. A dummy active region 60 is defined and a plurality of dummy switching devices 61 is formed on the dummy active region 60. Herein, the dummy switching device 61 includes a diode formed by selective epitaxial growth on the dummy active region 60. An N-type semiconductor 61a, i.e. a cathode terminal of the diode, is electrically connected to the dummy active region 60 and a P-type semiconductor 61b, i.e. an anode terminal of the diode, is electrically connected to a phase change resistor 63 through a lower electrode contact 62 which will be described below.

The lower electrode contact 62 is formed on the P-type semiconductor 61b of the respective switching devices 61 and the phase change resistor 63 is formed on the respective lower electrode contacts 62. That is, the switching device 61 is electrically connected to the phase change resistor 63 through the lower electrode contact 62. Herein, the respective phase change resistors 63 may include a phase change layer 63a and an upper electrode 63b, and may further include a lower electrode (not shown).

Bitlines BL0~BL7 are formed above the upper electrode 63b of the respective phase change resistors 63 so as to be spaced apart therefrom by a predetermined distance. That is, because an upper electrode contact is not formed on the phase change resistor 63, the phase change resistor 63 and a respective bitline BL are electrically isolated from each other. Particularly, the two outermost bitlines BL0, BL7 of the bitlines BL0~BL7 have a shape that is projected from the region corresponding to the dummy cell therebelow toward a lower via 65 which will be described later. Herein, the two outermost bitlines BL0, BL7 of the bitlines B0~B7 are preferably projected from the region corresponding to the dummy cell therebelow to the outside of the lower via 65. That is, when viewed on the cross-section as shown in FIG. 6, bitlines BL0 and BL7 are elongated in a horizontal direction extending laterally toward the lower vias 65.

The lower via 65 is formed in the dummy active region 60, outside the portion of the region formed with the dummy cell string 44, and the global row decoding line GXDEC is formed above the lower via so as to be spaced apart therefrom by a predetermined distance. That is, as an upper via is not formed on the lower via 65, the dummy active region 60 and the global decoding line GXDEC are electrically isolated from each other.

In the above structure, since the dummy active region 60 is not electrically connected with the global row decoding line GXDEC and the dummy cell string 44 is not electrically connected with the bitlines BL0~BL7, current does not flow to the dummy cell string 44 and thus the dummy cell string 44 can always be maintained in a turn-off state. Herein, the dummy active region 60 is preferably maintained at the ground voltage VSS.

Also, since two outermost bitlines BL0, BL7 of the bitlines BL0~BL7 have the shape projected from the region corresponding to the dummy cell therebelow to the outside, pattern collapse of the two bitlines BL0, BL7 can be prevented.

Figure 7:
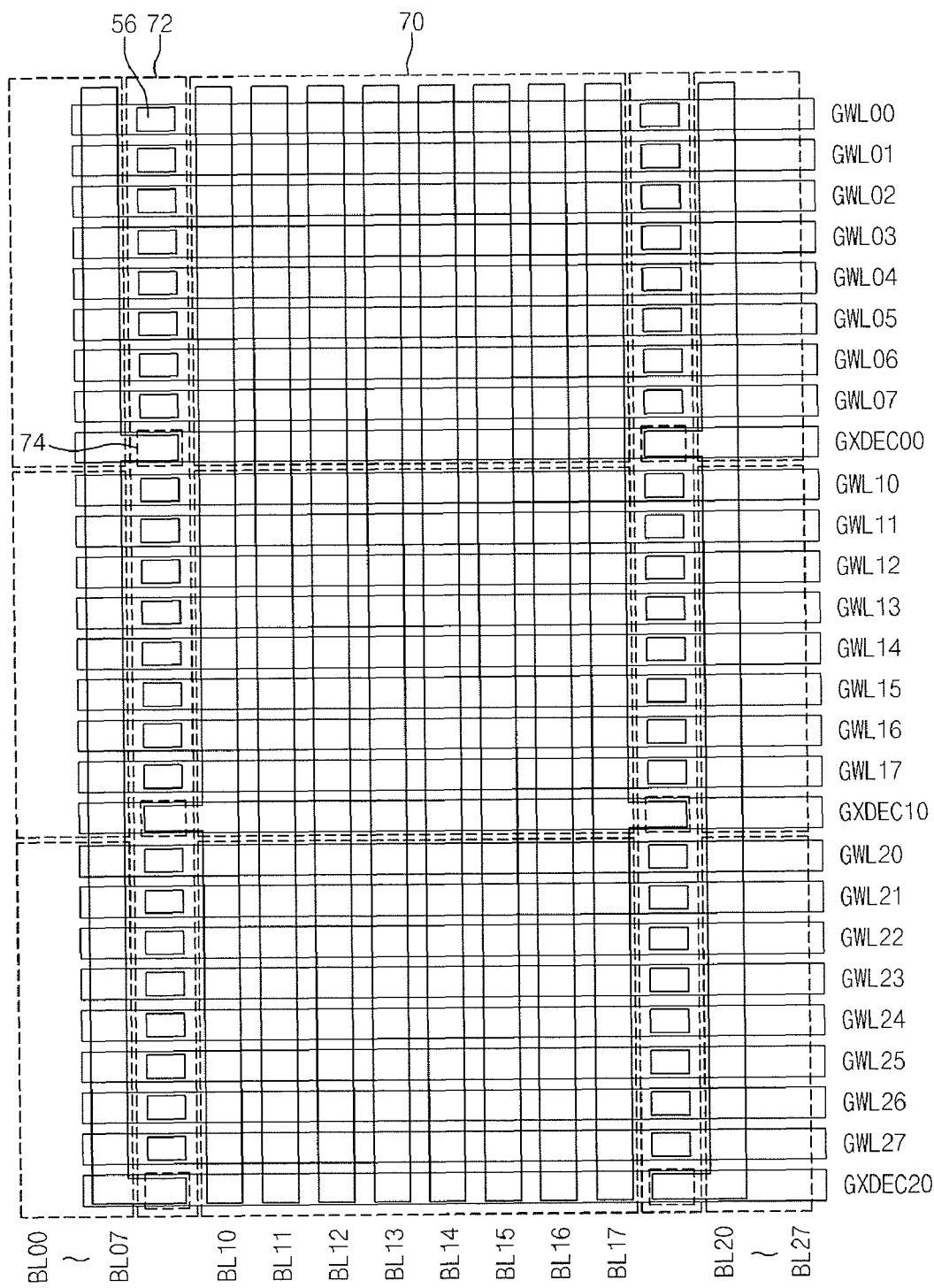
FIG. 7 is a plan view showing a layout structure of the PRAM according to one embodiment of the present invention.

FIG. 7 shows an example of a layout structure of bitlines and global wordlines corresponding to a plurality of cell arrays of a PRAM according to an embodiment of the present invention.

Referring to FIG. 7, active regions, in which memory cell string (not shown) and vias 56 are alternately disposed, and dummy active regions (not shown), in which dummy cell string (not shown) is disposed in the region corresponding to the active region for disposing the memory cell string therein, are alternately formed in a vertical direction.

Herein, the region in which the memory cell string and the dummy cell string are formed may be defined as a cell array region 70 and the region in which the vias 56 are formed may be defined as a via region 72.

In the cell array region 70, a plurality of bitlines BL00~BL07, BL10~BL17, BL20~BL27 are disposed in correspondence to respective memory cells and respective dummy cells so as to intersect with the active regions and dummy active regions, and a plurality of global wordlines GWL00~GWL07, GWL10~GWL17, GWL20~GWL27 are disposed above the plurality of bitlines BL00~BL07, BL10~BL17, BL20~BL27 so as to be overlapped with the active regions.

Also, a plurality of global row decoding lines GXDEC00, GXDEC10, GXDEC20 are disposed above the plurality of the bitlines BL00~BL07, BL10~BL17, BL20~BL27 so as to be overlapped with the dummy active regions. At this time, each of the global row decoding lines GXDEC00, GXDEC10, GXDEC20 are preferably disposed such that one global row decoding line GXDEC corresponds to one plurality of global wordlines (for example, GXDEC00 corresponds to GWL00~GWL07).

A plurality of upper vias 56, each respectively electrically connected with a respective wordline (for example, via 54 and global wordline GWL00), are disposed in the via region 72 placed between two bitline groups (for example, bitline groups BL00~BL07 and BL10~BL17).

The upper via is not formed in the region 74 of the via region 72 which corresponds to a global row decoding line GXDEC, and the outermost bitlines BL10, BL17 of the a predetermined bitline group (for example, BL10~BL17) corresponding to the cell array region 70 are extended to the region 74 corresponding to a global row decoding line GXDEC.

That is, with reference to FIG. 7, the outermost bitlines BL07, BL10, BL17, BL20 of the respective bitline groups BL00~BL07, BL10~BL17, BL20~BL27 have a shape projected to the region 74 corresponding to respective global row decoding lines GXDEC00, GXDEC10, GXDEC20. It is preferable that in a via region 74, one of the two bitlines BL formed along the sides of the via region 72 is projected to the region 74 corresponding to the global row decoding line GXDEC. For example, as shown in FIG. 7, two bitlines BL07, BL10 are formed along the via region 72. In the region 74 corresponding to global row decoding line GXDEC00 it is preferable that only one of the two bitlines BL07, BL10 extend into the region 74. For example, as shown in FIG. 7, BL07 is the one bitline that is projected into the region 74 corresponding to global row decoding line GXDEC00.

Particularly, it is preferable that the bitline BL07 disposed at one side of the via region 72 is projected in the region 74 corresponding to the global row decoding line, GXDEC00 and the bitline BL10 disposed at the opposite side of the via region 72 is projected in the region 74 corresponding to the next global row decoding line GXDEC10. That is, the bitlines (for example, BL07, BL10) disposed at opposite sides of the via region 72 are preferably formed such that the bitlines BL07, BL10 are alternately projected to the region 74 corresponding to the respective global row decoding lines GXDEC00, GXDEC10, GXDEC20.

A detailed layout structure of the region 74 corresponding to the global row decoding line GXDEC00 in the via region 72 and the bitline BL20 projected to the region 74 will be described with reference to FIG. 8.

Figure 8:
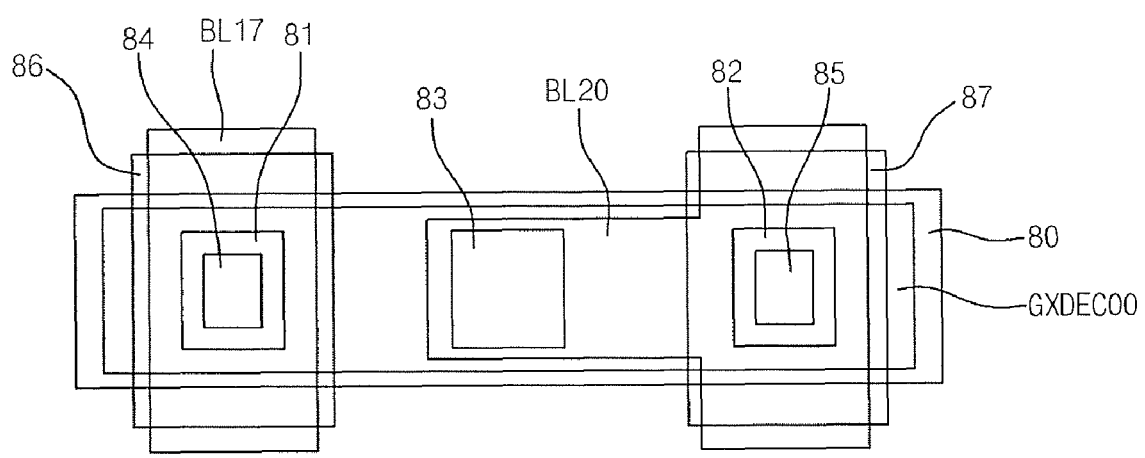
FIG. 8 is a plan view showing a layout structure of a via region and dummy cells disposed at both sides of the via region in the PRAM according to one embodiment of the present invention.

Referring to FIG. 8, a dummy active region 80 is defined within the cell array (not shown), and two dummy switching devices 81, 82 are disposed in the dummy active region 80 and a lower via 83 is disposed between the two dummy switching devices 81, 82.

Lower electrode contacts 84, 85 are disposed above the respective dummy switching devices 81, 82, and dummy phase change resistors 86, 87 are disposed above the respective lower electrode contacts 84, 85. Herein, the dummy switching device 81 and the dummy phase change resistor 86 are electrically connected with each other through the lower electrode contact 84, and the dummy switching device 82 and the dummy phase change resistor 87 are electrically connected with each other through the lower electrode contact 85.

The bitlines BL17, BL20 are disposed above the respective phase change resistors 86, 87. Herein, the respective bitlines BL17, BL20 are not electrically connected to with the respective phase change resistors 86, 87. Also, it is preferable that the bitline BL20 is disposed over the lower via 83 and the dummy phase change resistor 87 and has the shape projected from the dummy phase change resistor 87 to the region between the lower via 83 and the dummy phase change resistor 86.

The global row decoding line GXDEC is disposed above the respective bitlines BL17, BL20. Herein, the global row decoding line is not electrically connected with the bitlines BL17, BL20 and the lower via 83.

As described above, the PRAM according to one embodiment of the present invention cuts off electrical connection between the dummy cells and the bitlines and thus always maintains the dummy cells in the state of non-operation. Therefore, parasitic current due to the operation of the dummy cells is not generated and therefore the current detection margin of a sense amplifier can be ensured data access error due to the current detection may be prevented.

Also, the PRAM according to one embodiment of the present invention the outermost bitlines in respective cell arrays have a projected shape in regions corresponding to dummy cell, and thus can prevent pattern collapse of the outermost bitlines.

Further, as the pattern collapse of the outermost bitlines is prevented, the corresponding electrical short between the outermost bitlines and the global wordlines can be prevented and therefore an increase in power consumption upon data access and an increase in leakage current upon standby caused by a pattern collapse are not generated.

In addition, since it is not necessary to add dummy cells to the memory cell string or extend the region of the outermost bitlines corresponding to the memory cell string to the outside in order to prevent the electrical short between the outermost bitlines and the global wordlines, miniaturization of the memory cell is facilitated.

Another embodiment according to the present invention includes a PRAM capable of removing parasitic current due to dummy cells by supplying a predetermined voltage to a dummy active region to be formed with the dummy cells such that the dummy cells are not operated when a bitline is activated.

Figure 9:
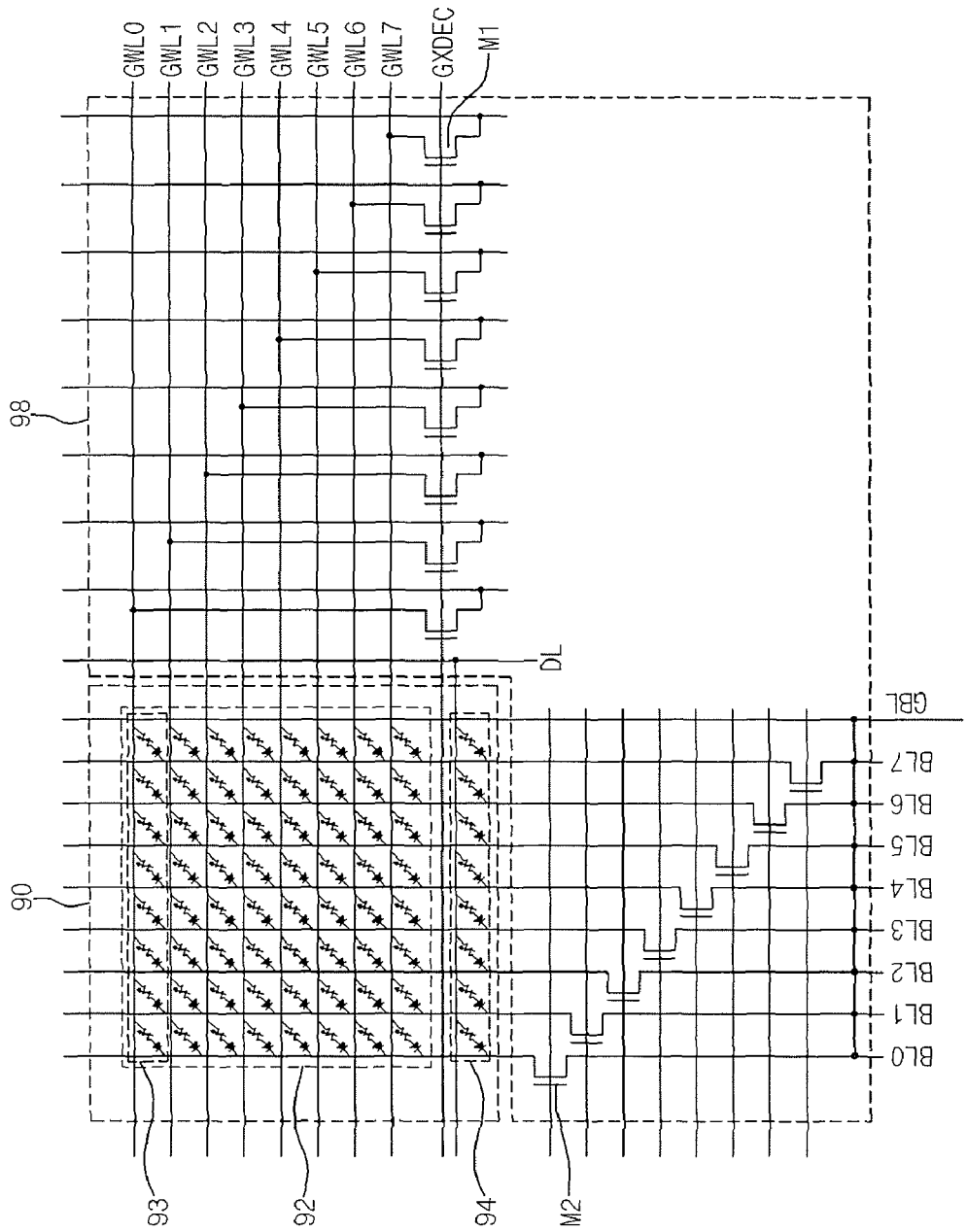
FIG. 9 is a circuit diagram showing a PRAM according to other embodiment of the present invention.

Specifically, the PRAM according this embodiment of the present invention, as shown in FIG. 9, includes a plurality of cell array units, each or which may include a cell array 90 and a cell array control unit 98.

The cell array 90 includes a plurality of memory cell strings 92 and at least one dummy cell string 94.

The memory cell strings 92 have the same structure as that of the memory cell strings 43 discussed above with reference to FIG. 4 and FIG. 5.

The dummy cell string 94 includes dummy cells formed between the dummy active region and are electrically connected to the dummy line DL and the bitlines BL0~BL7. Also, the dummy cells have the same phase change structure as that of memory cells forming the memory cell strings 92.

The cell array control unit 98 selects any one of the plurality of the global wordlines GWL0~GWL7 and supplies a first voltage to the selected global wordline upon data access. The cell array control unit 98 also selects any one of the plurality of the bitlines BL0~BL7 and supplies a second voltage to the selected bitline. In addition, the cell array control unit 98 supplies a third voltage having higher level than the second voltage to the dummy active region formed with the plurality of the dummy cells 94 through the dummy line DL. Herein, it is desirable that the first voltage is a ground voltage VSS, the second voltage is a boost voltage VPP having higher level than an external power voltage VDD, and the third voltage is the boost voltage VPP or, alternatively, a voltage having higher level than the boost voltage VPP.

As discussed above with regards to the cell array control unit 48 in FIG. 4, the cell array control unit 98 controls the data access of the cell array 90 and may include a plurality of first switching devices that control activation of the global wordlines GWL0~GWL7 and a plurality of second switching devices that control activation of the bitlines BL0~BL7.

As describe above, the PRAM according to the present embodiment includes a plurality of memory cells 92 and a plurality of dummy cells 94 within a cell array 90, and each memory cell 92 is selectively subject to phase change according to a potential difference between the respective global wordlines GWL0~GWL7 and the respective bitlines BL0~BL7 to access data.

The respective dummy cells are formed in the same phase change structure as the respective memory cells, and the dummy active region formed with the dummy cells 94 is disposed within a portion of the cell array that does not contain the global wordlines GWL0~GWL7, e.g. below the global row decoding line GXDEC. The dummy active region is supplied with a voltage through the dummy line DL having a level higher than the potential of the activated bitline.

Figure 10:
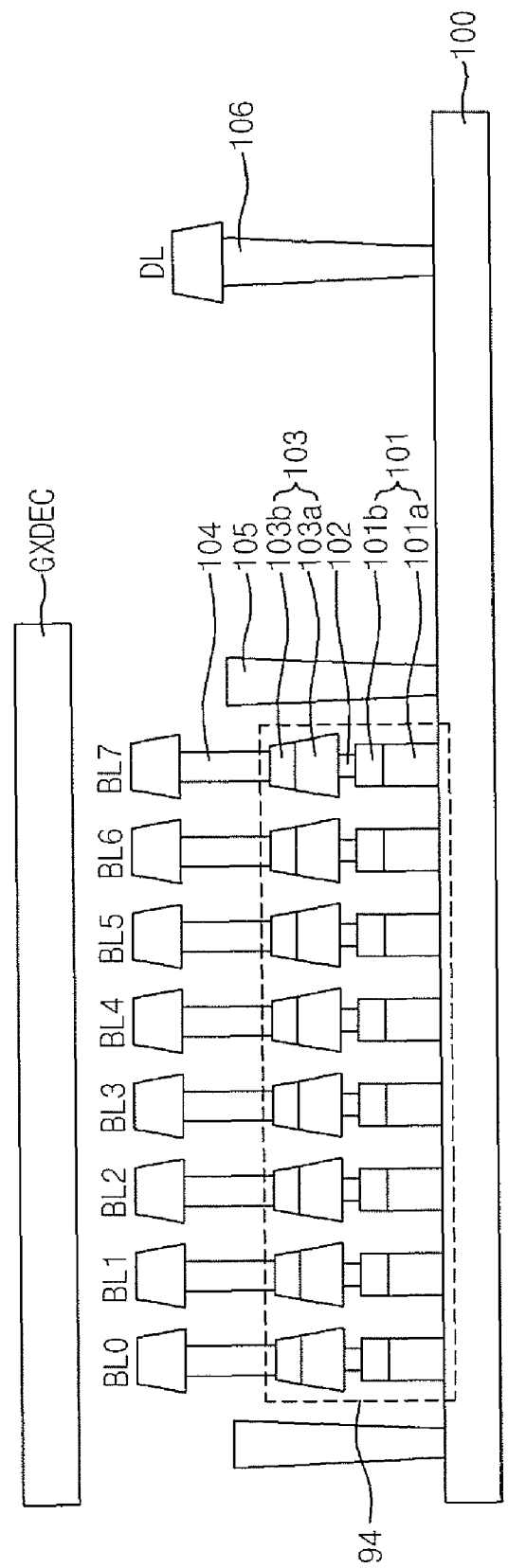
FIG. 10 is a cross-sectional view showing a structure of the dummy cell string 94 in FIG. 9.

The structure of the dummy cell string 94 is described with reference to FIG. 10. A dummy active region 100 is defined and a plurality of dummy switching devices 101 is formed on the dummy active region 100. Herein, a dummy switching device 101 includes a diode formed by selective epitaxial growth on the dummy active region 100. The diode includes an N-type semiconductor 101a, i.e. a cathode terminal of the diode electrically connected to the dummy active region 100 and a P-type semiconductor 101b, i.e. an anode terminal of the diode, electrically connected to a phase change resistor 103 through a lower electrode contact 102 which will be described in detail below.

The lower electrode contact 102 is formed on the P-type semiconductor 101b of the respective switching devices 101 and the phase change resistor 103 is formed on the respective lower electrode contacts 102. Herein, the respective phase change resistors 103 may include a phase change layer 103a and an upper electrode 103b, and may further include a lower electrode (not shown).

An upper electrode contact 104 is formed on the upper electrode 103b of the respective phase change resistors 103, and the bitlines BL0~BL7 are formed on respective upper electrode contacts 104.

Vias 105 are formed in the dummy active region 100 outside the portion of the active region formed with the dummy memory cell string 94 and a global row decoding line GXDEC is formed above the via 105 with a predetermined space.

A via 106 is formed on an edge, or extended portion, of the dummy active region 100 that corresponds to the edge, or extended portion, of the region of the cell array 90 in FIG. 9, and the dummy line DL, which is applied with a voltage having a level higher than the boost voltage VPP, is formed on the via 106. Herein, though the dummy line has been described as being formed on an edge of the dummy active region 100, it should be understood that the dummy line DL may be formed at an upper portion of any region in the dummy active region 100 excluding the region in which the dummy cell string 94 is formed. Alternatively, the dummy active region 100 is extended outside of the region of the cell array 90 in FIG. 9 and the dummy line DL may be formed above the extended dummy active region 100.

In the aforementioned structure, when the data access operation is not carried out, a reverse bias is formed in the dummy diode that forms the dummy switching device 101 and current does not flow to the dummy phase change resistor 103, because the bitlines BL0~BL7 are maintained at the level of the ground voltage VSS and the dummy active region 100 is maintained at the level higher than the boost voltage VPP.

When any one of the bitlines BL0~BL7 is activated, as a result of a data access operation being carried out by read or write command, the boost voltage VPP is supplied to the activated bitline BL. For example, when a data access operation is carried out by a read or write command and a bitline BL0 is activated, the boost voltage VPP is supplied to the activated bitline BL0. Therefore, an equipotential is formed between both ends of the dummy diode that forms the dummy switching device 101 such that a reverse bias is formed in the dummy diode and current does not flow to the phase change resistor 103.

Figure 11:
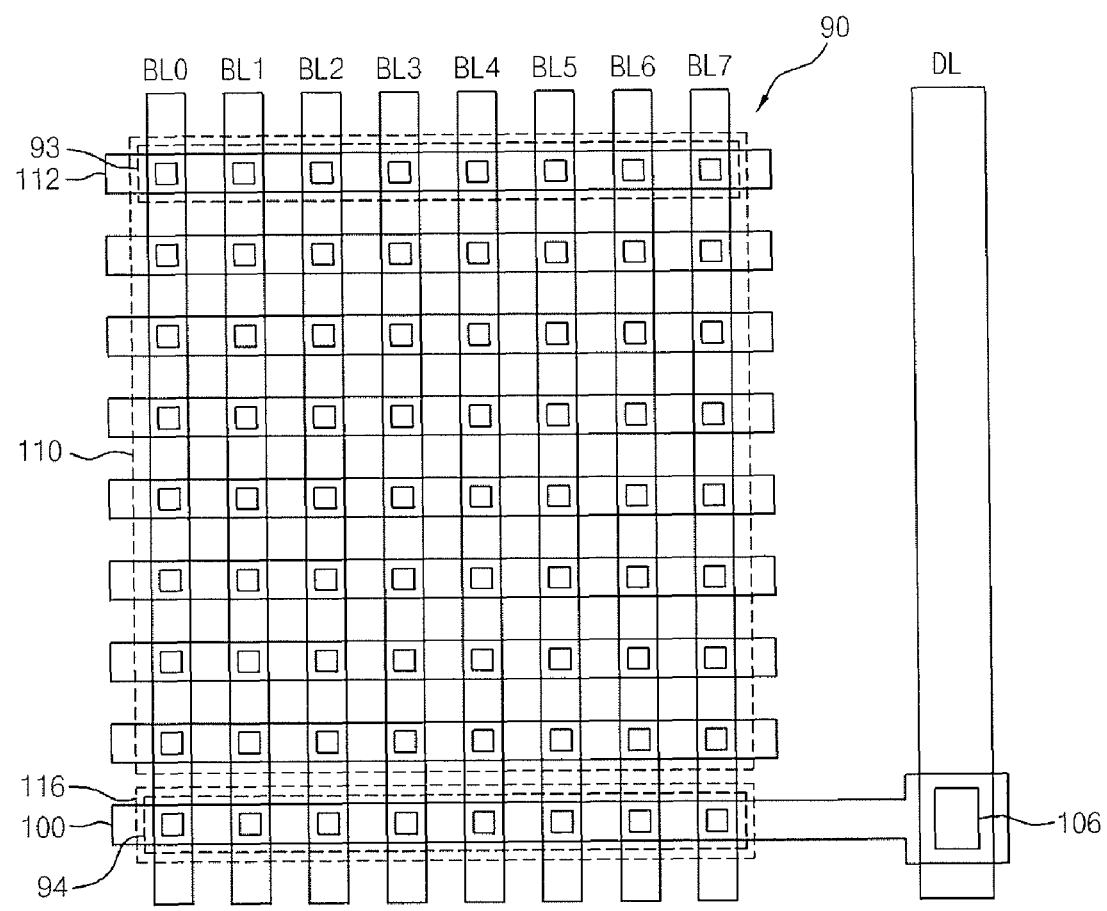
FIG. 11 is a plan view showing a layout structure of the PRAM according to other embodiment of the present invention.

FIG. 11 shows an embodiment of the structure of the dummy active region extended to the outside of the region of the cell array 90 in FIG. 9 so as to be electrically connected to the dummy line DL.

As shown in FIG. 11, a memory cell region 110 and a dummy cell region 116 are defined within the cell array 90, and a plurality of the active regions 112 are arranged in the memory cell region 110 in the direction corresponding to the global wordline (not shown). A memory cell string 93 is formed in an active region 112, and a plurality of bitlines BL0~BL7 are formed above the memory cell string 93 so as to intersect with the active region 112.

The dummy active region 100 corresponds to the global row decoding line (not shown) and an end of the dummy active region 100 is extended beyond the dummy cell region 116 disposed in the cell array 90. The via 106 is formed in the portion of the dummy active region 100 that extends beyond the outside of the cell array 90, and the via 106 electrically connects the dummy active region 100 to the dummy line DL formed at the outside of the cell array 90.

Figure 12:
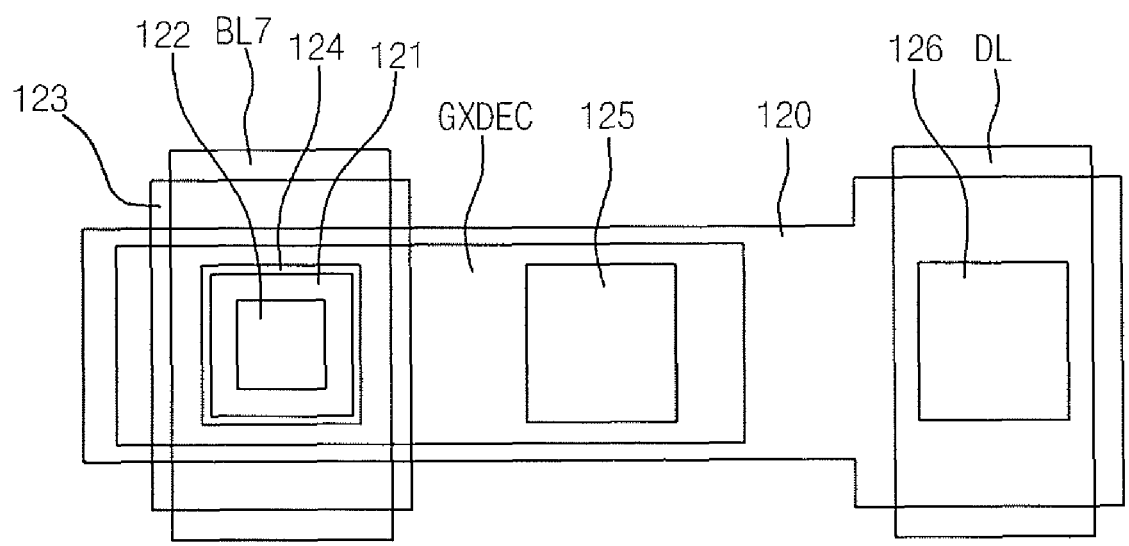
FIG. 12 is a plan view showing a layout structure of one dummy cell provided in the dummy cell 94 in FIG. 11 and a dummy line DL electrically connected to the dummy cell.

FIG. 12 shows a layout structure of the dummy cell arranged at the end of the dummy cell string 94 and the dummy line DL electrically connected to the dummy cell in the dummy cell region 116 according to an embodiment of the present invention.

Referring to FIG. 12, the dummy active region 120 is defined across the cell array (not shown) and the outside of the cell array, and the dummy switching device 121 is formed at one side of the dummy active region 120 defined within the cell array and the via 125 is formed at the opposite side.

The lower electrode contact 122 is placed above the dummy switching device 121 and the dummy phase change resistor 123 is placed above the lower electrode contact 122. Herein, the dummy switching device 121 and the dummy phase change resistor 123 are electrically connected with each other through the lower electrode contact 122.

The upper electrode contact 124 is placed at the upper portion of the phase change resistor 123, and the bitline BL7 is placed above the upper electrode contact 124. Herein, the phase change resistor 123 and the bitline BL7 are electrically connected with each other through the upper electrode contact 124.

The global row decoding line GXDEC is arranged at the upper portions of the bitline BL7 and the via 125. Herein, the global row decoding line GXDEC is not electrically connected to the bitline BL7 and the via 125.

The via 126 is placed above the dummy active region 120 which is defined the outside of the cell array, and the dummy line DL is arranged above the via 126. Herein, the dummy active region 120 and the dummy line DL are electrically connected with each other through the via 126.

As is apparent from the above description, the PRAM according to the present embodiment maintains, in the cell array including a plurality of memory cells and a plurality of dummy cells, both ends of the plurality of the dummy cells in equipotential or the plurality of the dummy cells in reverse biased state by applying a potential which is more than a bitline activation potential to the dummy active region formed with the plurality of dummy cells.

Therefore, since a parasitic current does not flow through the plurality of dummy cells upon activation of the bitline, current sensing margin of the sense amplifier can be ensured thereby preventing data access error due to current sensing can.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A phase change random access memory (PRAM), comprising:
   a cell array divided into an active region and a dummy active region;
   a bitline formed across the active region and the dummy active region; and
   a global wordline formed in the active region so as to intersect with the bitline,
   wherein the cell array comprises:
      a phase change memory cell formed at an intersection of the bitline and the global wordline in the active region, the phase change memory cell being electrically connected to both the bitline and the global wordline; and
      a phase change dummy cell formed below the bitline in the dummy active region, the phase change dummy cell being electrically isolated from the bitline.

2. The PRAM as set forth in claim 1, wherein the cell array further comprises a global row decoding line in the dummy active region, the global row decoding line transfers a signal for selecting the global wordline, and
   wherein the phase change dummy cell is formed below the global row decoding line.

3. The PRAM as set forth in claim 2, wherein the global row decoding line is disposed to intersect with the bitline and the global row decoding line is electrically isolated from the dummy active region.

4. The PRAM as set forth in claim 1, wherein the phase change memory cell comprises a switching device and a phase change resistor formed between the global wordline and the bitline, and
   the phase change dummy cell comprises a dummy switching device and a dummy phase change resistor formed below the bitline.

5. The PRAM as set forth in claim 4, wherein the switching device comprises a diode having a cathode terminal electrically connected to the global wordline and an anode terminal electrically connected to the phase change resistor, and
   the dummy switching device comprises a dummy diode having a cathode terminal electrically connected to the dummy active region and an anode terminal electrically connected to the dummy phase change resistor.

6. The PRAM as set forth in claim 5, wherein the dummy active region is electrically connected with a ground voltage.

7. A PRAM, comprising:
   a cell array region;
   a dummy active region formed in the cell array region;
   an active region formed in the cell array region having a phase change memory cell;
   a plurality of dummy switching devices formed on the dummy active region;
   a plurality of lower electrode contacts respectively formed on the plurality of the dummy switching devices;
   a plurality of dummy phase change resistors respectively formed on the plurality of the lower electrode contacts, the plurality of dummy phase change resistors being electrically connected to the plurality of dummy switching devices through the plurality of lower electrode contacts;
   a plurality of bitlines respectively formed above the plurality of the dummy phase change resistors, wherein the plurality of bitlines are spaced apart from the plurality of the dummy phase change resistors by a predetermined distance; and
   a global row decoding line formed above the plurality of the bitlines, wherein the global row decoding line is spaced apart from the plurality of bitlines by a predetermined distance.

8. The PRAM as set forth in claim 7, wherein the dummy active region is electrically isolated from the global row decoding line.

9. The PRAM as set forth in claim 7, wherein each dummy switching device comprises a cathode terminal electrically connected to the active region and an anode terminal electrically connected to a respective phase change resistor.

10. The PRAM as set forth in claim 7, wherein the dummy active region is electrically connected with a ground voltage.

11. A PRAM, comprising:
    a plurality of global wordlines formed within a cell array region;
    a plurality of phase change memory cell strings formed in a first active region within the cell array region, each phase change memory cell string including a plurality of phase change memory cells, wherein the first active region is electrically connected to the global wordlines;
    at least one phase change dummy cell string formed in a second active region within the cell array region, the dummy cell string having a plurality of phase change dummy cells; and
    a plurality of bitlines formed between upper portions of the phase change memory cells and upper portions the phase change dummy cells and lower portions of the global wordlines,
    wherein the plurality of bitlines are formed as to be substantially perpendicular to the plurality of global wordlines and electrically connected with the phase change memory cells, and
    wherein the bitlines formed at outermost sides of the phase change memory cell string and the phase change dummy cell string have a shape projected from the region corresponding to the phase change dummy cell string extending away from a central portion of the cell array.

12. The PRAM as set forth in claim 11, wherein the phase change dummy cell string is formed in the second active region below the global row decoding line, and the global row decoding line being disposed on a layer within the cell array region together with and parallel to the global wordlines for transferring a signal for selecting the global wordlines and be electrically isolated from the second active region.

13. The PRAM as set forth in claim 12, wherein first lower vias and first upper vias are formed in a portion of the first active region beyond ends of the phase change memory cell string, second lower vias having the same height as the first lower vias are formed in a portion of the second active region beyond ends of the phase change dummy cell string, and
    wherein the global wordlines are electrically connected to the first active region through the first lower vias and the upper vias.

14. The PRAM as set forth in claim 13, wherein the bitlines formed at the outermost sides of the phase change memory cell string and the phase change dummy cell string have a shape projected from both outermost sides of the phase change dummy cell string to an upper portion of the second lower via.

15. The PRAM as set forth in claim 11, wherein the bitlines are formed spaced apart from the phase change dummy cell string by a predetermined distance and electrically isolated from the phase change dummy cells.

16. The PRAM as set forth in claim 11, wherein each phase change memory cell of the plurality of phase change memory cells comprises a switching device and a phase change resistor formed between the first active region and a bitline of the plurality of bitlines, and
    wherein each phase change dummy cell of the plurality of phase change dummy cells comprises a dummy switching device and a dummy phase change resistor formed in the second active region.

17. The PRAM as set forth in claim 16, wherein each switching device comprises a cathode terminal electrically connected to the first active region and an anode terminal electrically connected to the phase change resistor, and
    wherein the dummy switching device comprises a cathode terminal electrically connected to the second active region and an anode terminal electrically connected to the dummy phase change resistor.

18. The PRAM as set forth in claim 17, wherein the second active region is electrically connected with a ground voltage.

19. A PRAM, comprising:
    a bitline;
    a global word line intersecting the bitline;
    a phase change memory cell formed on a first active region within a cell array region, electrically connected with the bitline and the global wordline,
        wherein phase change of the phase change memory cell occurs when a first voltage is supplied to the bitline and a second voltage having lower level than the first voltage is supplied to the global wordline; and
    a phase change dummy cell formed on a second active region within the cell array region and electrically connected to the bitline,
        wherein the first active region is electrically connected to the global wordline and the second active region is electrically connected to a dummy line supplied with a third voltage having higher level than the first voltage.

20. The PRAM as set forth in claim 19, wherein the first voltage is a boost voltage having higher level than an external power voltage, the second voltage is a ground voltage, and the third voltage is a voltage having higher level than the boost voltage.

21. The PRAM as set forth in claim 19, wherein the phase change memory cell comprises a switching device and a phase change resistor formed between the first active region and the bitline, and
    wherein the phase change dummy cell comprises a dummy switching device and a dummy phase change resistor formed between the second active region and the bitline.

22. The PRAM as set forth in claim 21, wherein the switching device comprises a diode having a cathode terminal electrically connected to the first active region and an anode electrically connected to the phase change resistor, and
    the dummy switching device comprises a dummy diode having a cathode terminal electrically connected to the second active region and an anode terminal electrically connected to the dummy phase change resistor.

23. The PRAM as set forth in claim 19, wherein the phase change dummy cell is formed below a global row decoding line, the global row decoding line being disposed parallel to the global wordlines within the cell array region and electrically isolated from the second active region.

24. The PRAM as set forth in claim 19, wherein the dummy line is electrically connected to the second active region through a via formed within a portion of the second active region beyond the phase change dummy cell.

25. The PRAM as set forth in claim 24, wherein the dummy line is formed in a lower layer than the global wordlines.

26. A PRAM, comprising:
    bitlines;
    global wordlines intersecting with the bitlines;
    a cell array including a plurality of phase change memory cells respectively formed at intersection points of the bitlines and the global wordlines and a plurality of phase change dummy cells respectively formed between a dummy active region and the bitlines, wherein the dummy active region is electrically connected to a dummy line; and
    a cell array control unit selecting one of the plurality of the global wordlines and supplying a first voltage to the selected global wordline upon a data access selecting one of the plurality of the bitlines and supplying a second voltage having a level higher than the level of the first voltage to the selected bitline upon the data access, and supplying a third voltage having a level higher than the level of the second voltage to the dummy line,
    wherein the phase change of a phase change memory cell is carried out to access data when a potential of a respective bitline is higher than a potential of a respective global wordline intersecting therewith, and
    wherein the phase change of a phase change dummy cell is carried out when a potential of a respective bitlines is higher than a potential of the dummy active region.

27. The PRAM as set forth in claim 26, wherein the first voltage is a ground voltage, the second voltage is a boost voltage having a level higher than the level of an external power voltage, and the third voltage has a level higher than the level of the boost voltage.

28. The PRAM as set forth in claim 26, wherein a global row decoding line selecting the global wordlines is formed above the plurality of the dummy cells, and the global row decoding line and the dummy active region are electrically isolated from each other.

29. The PRAM as set forth in claim 26, wherein each memory cell comprises a switching device and a phase change resistor electrically connected between the respective global wordlines and the respective bitlines, and each dummy cell comprises a dummy switching device and a dummy phase change resistor electrically connected between the dummy active region and the respective bitlines.

30. The PRAM as set forth in claim 29, wherein a switching device comprises a diode having a cathode terminal electrically connected to a respective global wordline and an anode terminal electrically connected to a respective phase change resistor, and each dummy switching device includes a dummy diode having a cathode terminal electrically connected to the dummy active region and an anode terminal electrically connected to a respective dummy phase change resistor.

31. A layout method of a PRAM, comprising the steps of:
    forming a plurality of first active regions in which first cell array regions and first via regions are alternately disposed along a first direction on a substrate and forming at least one second active region corresponding to the first active regions, in which second cell array regions and second via regions are alternately disposed, on the substrate along the first direction;
    forming a phase change memory cell string in respective first cell array regions, forming a via in respective first via regions, and forming a phase change dummy cell string in respective second cell array regions;
    forming a plurality of bitlines in a second direction above the respective phase change memory cells and the respective phase change dummy cell in a second direction, the second direction intersecting with the first direction, wherein a bitline of the plurality of the bitlines which is adjacent to the via region is formed in a structure projected from the second cell array region to the second via region; and forming global wordlines overlapped with the respective first active region and electrically connected to the respective first active region through the via and a global row decoding line overlapped with the second active region, above the bitlines.

32. The method as set forth in claim 31, wherein in the step of forming the plurality of bitlines, the bitlines which are disposed adjacent to the first via regions are formed in a structure alternately projected to the first via region and the bitlines disposed adjacent to the second via regions are formed in a structure alternately projected to the second via regions.

33. The method as set forth in claim 31, wherein in the step of forming the bitlines, the respective bitlines are formed so as to be electrically connected with the respective phase change memory cells and electrically isolated from the respective phase change dummy cells.

34. A layout method of a PRAM, comprising the steps of:
forming a plurality of first active region within a cell region and forming at least one second active region within the cell array region;
forming a plurality of phase change memory cells in respective first active regions and forming a plurality of phase change dummy cells having the same structure as the phase change memory cells in the respective second active region;
forming a plurality of bitlines electrically connected to the respective phase change memory cells and the respective phase change dummy cells above the respective phase change memory cells and the respective phase change dummy cells so as to intersect with the first and second active regions,
wherein the bitlines are maintained at a first voltage level upon inactivation and have a second voltage level higher than the first voltage level upon activation;
forming a plurality of global wordlines electrically connected to the first active region above the plurality of the bitlines so as to be overlapped with the respective active regions, wherein the global wordlines are maintained at the second voltage level state upon inactivation and have the first voltage level upon activation; and
forming a dummy line electrically connected to the second active region and maintained at a level higher than the second voltage, the dummy line being formed beyond an end of the dummy cells.

35. The method as set forth in claim 34, wherein the first voltage is a ground voltage, the second voltage is a boost voltage having a level higher than an external power voltage, and the third voltage is a voltage having a level higher than the boost voltage.

36. The method as set forth in claim 34, wherein the dummy line and the plurality of the bitlines are formed at the same layer above the second active region and a via is formed between the second active region and the dummy line such that the second active region and the dummy line are electrically connected through the via.

37. The method as set forth in claim 34, wherein a third active region is formed to extend from the second active region beyond the cell array region is, the dummy line is formed above the third active region, a via is formed between the third active region and the dummy line such that the second active region, the third active region, and the dummy line are electrically connected with each other through the via.

38. The method as set forth in claim 34, wherein a global row decoding line selecting the plurality of the global wordlines is formed above the plurality of the bitlines overlapped with the respective second active regions.

39. The method as set forth in claim 34, wherein the respective phase change memory cells comprise:
a switching device including a first N-type semiconductor and a first P-type semiconductor formed on the first active region; and
a phase change resistor formed above the first P-type semiconductor and electrically connected to the switching device.

40. The method as set forth in claim 39, wherein the respective phase change dummy cells comprise:
a dummy switching device including a second N-type semiconductor and a second P-type semiconductor formed on the second active region; and
a dummy phase change resistor formed above the second P-type semiconductor and electrically connected to the dummy switching device.

* * * * *